(12) United States Patent
Candelier et al.

(10) Patent No.: US 6,421,293 B1
(45) Date of Patent: Jul. 16, 2002

(54) ONE-TIME PROGRAMMABLE MEMORY CELL IN CMOS TECHNOLOGY

(75) Inventors: Philippe Candelier, Saint Mury Monteymond; Jean-Pierre Schoellkopf, Grenoble, both of (FR)

(73) Assignee: STMicroelectronics S.A., Gentilly (FR)

( * ) Notice: Subject to any disclaimer, the term of this patent is extended or adjusted under 35 U.S.C. 154(b) by 0 days.

(21) Appl. No.: 09/470,897

(22) Filed: Dec. 22, 1999

(30) Foreign Application Priority Data

Dec. 23, 1998 (FR) .............................. 98 16582

(51) Int. Cl.[7] .................................. G11C 7/00
(52) U.S. Cl. ...................... 365/225.7; 365/149
(58) Field of Search ............... 365/225.7, 149; 257/344, 408

(56) References Cited

U.S. PATENT DOCUMENTS

| | | | |
|---|---|---|---|
| 3,983,545 A | 9/1976 | Cordaro | 340/173 |
| 4,151,610 A | 4/1979 | Suzuki et al. | 365/222 |
| 4,472,792 A | 9/1984 | Shimohigashi et al. | 365/189 |
| 4,542,481 A | 9/1985 | Lange | 365/14 |
| 4,782,466 A * | 11/1988 | Yamaguchi | 365/149 |
| 4,794,571 A | 12/1988 | Uchida | 365/205 |
| 4,943,538 A | 7/1990 | Mohsen et al. | 437/52 |
| H986 H * | 11/1991 | Codella | 437/41 |
| 5,324,681 A | 6/1994 | Lowrey et al. | 437/52 |
| 5,401,933 A | 3/1995 | Yoneda | 219/117.1 |
| 5,428,236 A | 6/1995 | Uchida | 257/305 |
| 5,430,319 A | 7/1995 | Fournel et al. | 257/309 |
| 6,078,080 A * | 6/2000 | Kadosh | 257/344 |

FOREIGN PATENT DOCUMENTS

| | | |
|---|---|---|
| EP | 0 032 279 | 7/1981 |
| EP | 0 528 417 B1 | 2/1993 |
| WO | 90/07794 | 7/1990 |

OTHER PUBLICATIONS

Klepner, "One–Device Storage Cell With Implanted Storage Node," *IBM Technical Disclosure Bulletin* 19(2):458–459, Jul. 1976.

* cited by examiner

*Primary Examiner*—A. Zarabian
(74) *Attorney, Agent, or Firm*—Lisa E. Jorgenson; E. Russell Tarleton; Seed IP Law Group PLLC

(57) ABSTRACT

An OTP memory cell in CMOS technology, including a capacitor associated in series with an unbalanced programming transistor, the drain of which is made of a region deeper and less doped than the source.

5 Claims, 2 Drawing Sheets

ONE-TIME PROGRAMMABLE MEMORY CELL IN CMOS TECHNOLOGY

BACKGROUND OF THE INVENTION

1. Field of the Invention

The present invention relates to the field of one-time programmable (OTP) non-volatile memory cells, which can keep a programmed state even after the circuit is powered off. The present invention more specifically relates to such a memory cell comprising an oxide capacitor.

2. Discussion of the Related Art

An example of application of OTP cells is the formation of redundancy elements, which are generally provided in memories made in the form of one or several integrated circuit arrays, to functionally replace a defective memory element. The function of the OTP cells is to program the shifting of the memory rows or columns upon use of a redundancy element to overcome the failure of a column or a row of the array.

In this type of application, either elements fusible by a laser, for example, or OTP memory cells of EEPROM type or of the floating-gate transistor type are used. All these conventional structures have the major disadvantage of not being compatible with simple CMOS manufacturing methods. In particular, non-volatile EPROM-type memory cells require two gate oxide thicknesses while a standard CMOS manufacturing method only uses one.

In a standard CMOS method, after the forming of source and drain regions of P-channel and N-channel MOS transistors in a silicon substrate, a single oxide layer (generally, silicon oxide) and a single polysilicon layer are deposited to form the transistor gates before the metallization levels.

Polysilicon fusible structures are also known, however, which require a strong programming current to obtain the fusion (on the order of 100 mA).

The category of OTP cells to which the present invention applies is generally called an "anti-fuse" structure since the unprogrammed state of the cell is a state of isolation of two electrodes and its programmed state is a state of current flow. The cells are, more specifically, formed of a capacitor formed of an oxide thickness likely to be made conductive (to break down) after application of an overvoltage between the two electrodes of the capacitor.

A problem which arises in the making of such an oxide breakdown structure with a standard CMOS method is linked to the switching of the high voltage required to break down the capacitors. Indeed, standard transistors cannot switch this high voltage without being, themselves, in a breakdown state.

For example, in a technology where the minimum dimension of a mask pattern is 0.25 μm, the CMOS circuit supply voltage generally is on the order of 2.5 V, while an oxide breakdown OTP cell requires on the order of 10 V for an oxide having a thickness on the order of 5 nm, which is the usual thickness of the gate oxide in this technology.

While such a 10-V voltage is generally available on the integrated circuit boards for which the memory integrated circuits are intended, this voltage is not compatible with addressing selection structures and memory input-output stages, the operating voltage of which is linked to the CMOS method used.

U.S. Pat. No. 4,943,538 discloses an anti-fuse memory cell wherein several oxide levels are necessary. Accordingly, this memory cannot be implemented without additional steps with respect to a conventional CMOS process using only one oxide level.

U.S. Pat. No. 5,324,681 and European Pat. Application 0528417 disclose anti-fuse memory cells using a DRAM manufacturing method with two oxides (the CMOS oxide and the oxide of the DRAM capacitors that is thinner so as to be breakable with a conventional transistor). It is accordingly necessary to add steps with respect to a conventional CMOS process.

SUMMARY OF THE INVENTION

The present invention aims at providing a novel OTP memory cell of oxide breakdown type, which is compatible with a simple CMOS manufacturing method. In particular, the present invention aims at providing a solution which requires a single gate oxide level in the manufacturing method.

The present invention also aims at making it possible for the memory cells to be manufactured with no additional step with respect to a conventional CMOS method.

Thus, the present invention provides an OTP memory cell in CMOS technology, including a capacitor associated in series with an unbalanced programming transistor, the drain of which is made of a region that is deeper and less doped than the source.

According to an embodiment of the present invention, this series association is connected between two terminals of application of a supply voltage.

According to an embodiment of the present invention, a first electrode of the capacitor is formed by said region.

According to an embodiment of the present invention, the capacitor is formed in an oxide level constitutive of transistor gates.

According to an embodiment of the present invention, a second electrode of the capacitor is adapted to receiving, in read mode, a relatively low voltage and, in programming, a relatively high voltage.

According to an embodiment of the present invention, the transistor and the capacitor are sized so that, in a programming cycle and for an unselected cell, the voltage across the capacitor remains smaller than its breakdown voltage when the currents in the capacitor and in the transistor are balanced.

According to an embodiment of the present invention, the transistor is sized to limit the current in a selected cell while allowing a breakdown of the oxide constitutive of the capacitor.

The invention also provides a method for manufacturing OTP memory cells of the anti-fuse type wherein the unbalanced drain regions of the programming transistors of a first channel type are formed simultaneously with the wells aimed at receiving MOS transistors of a second channel type.

The foregoing features and advantages of the present invention, will be discussed in detail in the following non-limiting description of specific embodiments in connection with the accompanying drawings.

DETAILED DESCRIPTION

Figure 1:
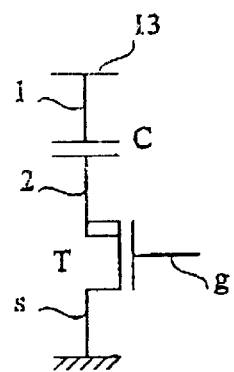
FIG. 1 schematically shows an embodiment of an OTP cell according to the present invention.

The same elements have been designated by the same references in the different drawings. For clarity, only those elements which are necessary to the understanding of the present invention have been shown in the drawings and will be described hereafter.

A feature of the present invention is to associate, in CMOS technology, an oxide capacitor in series with a programming transistor to form a non-volatile memory cell.

FIG. 1 shows the electric diagram of such a non-volatile memory cell according to the present invention. Oxide capacitor C has a terminal 1 adapted for connection to a more positive supply terminal and a terminal 2 forming an interconnection node with drain d of a MOS programming transistor T, the source s of which is connected to a more negative supply terminal (generally, the ground).

Figure 2:
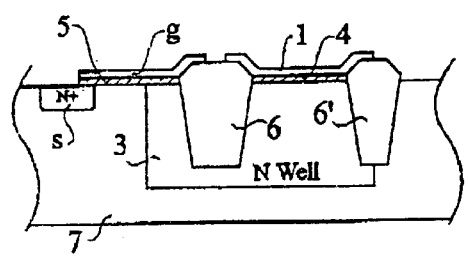
FIG. 2 is a cross-section of a memory cell according to the present invention.

According to the present invention, transistor T is an unbalanced transistor, the drain of which is formed by a region that is less doped and deeper than the source. Preferentially, one uses the step of formation of wells having the same conductivity type as the channel to form the drain, the source remaining formed of a more reduced region (than the drain), like the sources and drains of the other transistors of the conventional CMOS integrated circuit. Thus, in the example shown where transistor T is an NMOS transistor, the drain of this transistor is formed by a deep N type region. FIG. 2 is a schematic section view of such a transistor. The drain of the NMOS transistor is symbolized by an N well 3. The memory cell of the present invention such as shown in FIG. 2 thus includes, for example, starting from a P-type substrate 7, an N well intended for forming not only the drain of transistor T, but also a first electrode 2 of capacitor C. The use of such an asymmetric or unbalanced transistor having its drain formed of a "well" enables applying a greater voltage on the transistor drain without damaging it. This type of transistor is generally designated as a drift MOS transistor.

According to the invention, the making of such an unbalanced transistor requires no additional step with respect to the conventional CMOS method. Indeed, wells are conventionally formed to house the transistors having a channel of same type as the substrate. Thus, an advantage of the present invention is that the making of the programming transistors (which must withstand a greater voltage than the CMOS transistors of the rest of the circuit, as will be seen hereafter) is performed by means of the pattern of the mask for forming the wells (for example, of type N, if the substrate is of type P) in which are formed the transistors having channels of same type as the substrate, to provide the drains of the unbalanced transistors.

As illustrated in FIG. 2, capacitor C is formed of an oxide region 4 formed in the same oxide as oxide 5 of gate g of the transistors. A polysilicon layer added on the oxide layer enables forming second electrode 1 of capacitor C as well as gate electrode g of transistor T.

In the example of FIG. 2, the oxide region 4 of capacitor C is separated from the gate oxide region 5 and from the neighboring devices (not shown) by two lateral shallow trench isolations 6 and 6' filled with oxide. The trenches 6 and 6' have also the purpose of creating an access resistance to the transistor. The lowly doped region 3 extends on both sides of region 6, and under this region, and ends at the region 6', the region 6 separating the surface of regions 4 and 5.

A region (not shown) more heavily doped than well 3 (N+), that is, for example, doped like region s, can be provided in the well 3. This region has the function of enabling contact with drain of transistor T, and thus with storage node 2 of the cell. It should however be noted that such a contact area is optional. Indeed, well 3 may also form the drain well of an N-channel MOS transistor of a read circuit, as will be seen hereafter in relation with FIG. 5, in which case no contact area is necessary.

It should also be noted that the representation of FIG. 2 is simplified and symbolical. In particular, the capacitor may, for example, be separated from transistor T by a thick oxide guard ring. In this case, the connection between electrode 2 and the drain of transistor T will be ensured by an upper metallization level.

The function of transistor T is to enable selection, for a programming, of the memory cell thus formed by causing the breakdown of gate oxide 4 of the capacitor, to make the (anti-fuse) cell conductive.

According to the present invention, a cycle of programming a memory cell illustrated by FIGS. 1 and 2 is performed in three main steps.

In a first step, the involved cell is selected by means of transistor T of this cell, by bringing its gate g to a potential Vdd (for example, 2.5 V) corresponding to the potential of a CMOS logic circuit.

In a second step, a voltage ramp Vprog (for example, from 0 to 10 V in a few hundreds of milliseconds) is applied to capacitor programming electrode 1.

Voltage ramp Vprog causes the breakdown of oxide 4 of capacitor C. In this breakdown, transistor T, the drain of which is formed by well 3, limits the current between capacitor electrode 1 and source s of transistor T.

Since a memory cell according to the present invention is generally contained in an array in which it is chosen to select one or several cells such as illustrated in FIGS. 1 and 2, only the selected cells must be programmed while voltage step Vprog is applied to all cells.

Accordingly, upon programming of an array of OTP memory cells according to the present invention, the cells that are not selected by their respective transistors T must not see the oxide of their respective capacitors break down upon application of voltage ramp Vprog.

Assuming that a memory cell is not selected, gate g of its transistor is in the low CMOS logic state, for example, 0 V. Accordingly, at the beginning of the programming ramp, it is assumed that capacitor C is not charged. A 10-V voltage thus is present across transistor T and a zero voltage is present across capacitor C. This results in a leakage current Ioff flowing from transistor T which charges node 2 of the cell until a balance is reached between the current in transistor T and the current in capacitor C.

Figure 3:
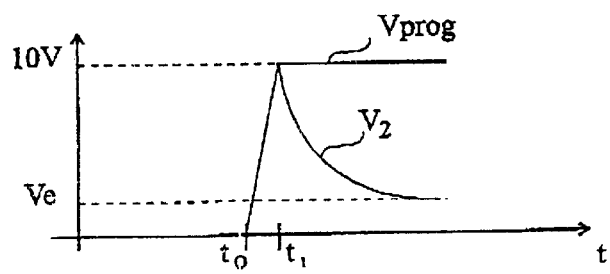
FIG. 3 illustrates the programming of a cell according to the present invention.

This phenomenon is illustrated by FIG. 3, which shows, in the form of timing diagrams, the variation of the potential at node 2 of interconnection between capacitor C and transistor T upon application of a programming voltage step or ramp Vprog when the cell is not selected.

Voltage ramp Vprog is applied between times t0 and t1. Between these times, the shape of voltage V2 at node 2 follows voltage Vprog (the voltage across capacitor C being zero). At time t1 when voltage Vprog reaches its maximum (for example, 10 V), potential V2 of terminal 2 starts decreasing until the current in transistor T reaches the current in capacitor C. This voltage Ve is the point of equilibrium of an unprogrammed memory cell according to the present invention.

Capacitor C and transistor T of a memory cell according to the present invention are sized so that the point of equilibrium (current in capacitor C=current in transistor T) is such that the potential difference across capacitor C remains smaller than its breakdown voltage. This condition guarantees the maintaining in an unprogrammed state of a cell that is not selected.

Figure 4:
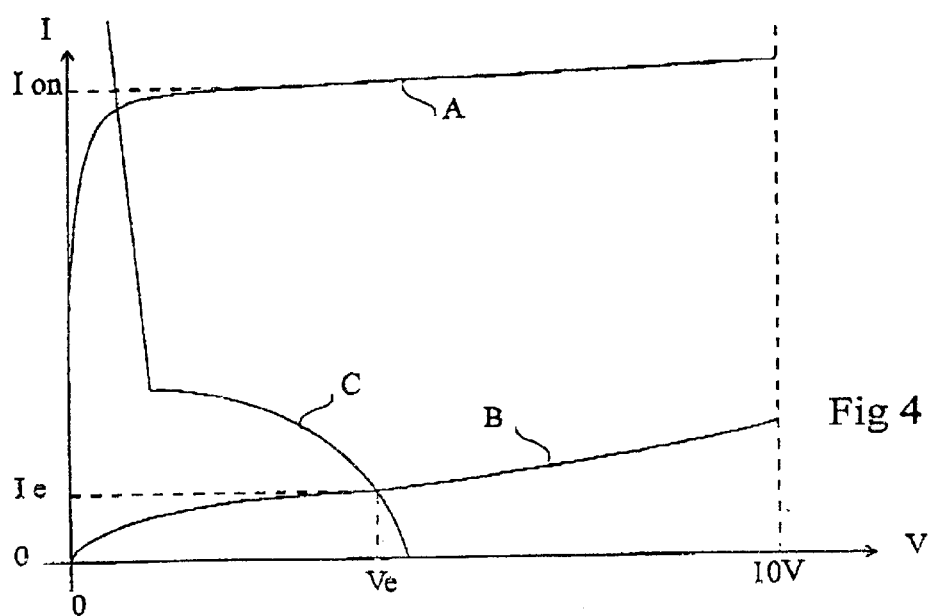
FIG. 4 illustrates the sizing criteria of a capacitor and of the programming transistor of an OTP memory cell according to the present invention.

FIG. 4 illustrates the characteristic of the point of equilibrium Ve according to the present invention in the association of a capacitor and of an unbalanced transistor. This drawing shows several current-voltage characteristics of a memory cell according to the present invention.

A first curve A provides the current in the transistor T of a selected cell. This current Ion abruptly increases to reach a high asymptotic value while the gate voltage of transistor T is, for example, 2.5 V.

A second curve B illustrates the leakage current in transistor T for an unselected cell, that is, a cell having its gate at the same potential as its source. In this case, leakage current Ioff increases as the voltage across the transistor increases.

A third curve C illustrates the shape of the current in capacitor C. For clarity, this curve has been shown with curves A and B, but it should be noted that its voltage scale is inverted. Thus, curve C indicates a beginning of "Fowler-Nordheim"-type conduction for a voltage on the order of 5 V. The current in the capacitor then increases with the electric field until the breakdown (reversal point of curve C), which occurs for a voltage on the order of 9 V, is reached.

Curve C crosses curves A and B. The intersection between curve A and curve C represents the breakdown point of the capacitor oxide in the programming of a selected cell. The intersection between curve B and curve C indicates the point of equilibrium (Ie, Ve) of an unselected cell.

According to the present invention, the respective dimensions of transistor T and of capacitor C will be chosen to fulfill, preferably simultaneously, the following conditions:

1) for transistors T, to have a gate length-to-width ratio such that leakage current Ioff is minimal. A compromise will however be selected to maintain a sufficient read current. Indeed, the higher current Ion, the lower the capacitor oxide resistance, once the capacitor has broken down.

2) for capacitor C, a compromise will be selected between the smallest possible size to minimize the density of cells according to the present invention, but sufficient to obtain a voltage across the capacitor that is the smallest possible at the point of equilibrium, so as not to break down the cells which are not selected.

As a specific example of embodiment, a memory cell according to the present invention may be made, in 0.25 $\mu$m technology, by using transistors T having gate length-to-width ratios included between 0.5 and 5 and, preferably, close to 1. The surfaces of capacitors C will range, for example, from 0.2 $\mu m^2$ to 50 $\mu m^2$, preferably on the order of 25 $\mu m^2$.

It should be noted that an OTP cell according to the present invention is perfectly compatible with the use of a conventional electric diagram to form the read addressing structures. However, in the embodiment described hereabove (N-type well), the reading will preferably be performed in accumulation, that is, with a positive gate voltage. In other words, the reading will be performed while the voltage of electrode 1 is positive and greater than the voltage of drain 3, this, to have a sufficient read mode current.

Figure 5:
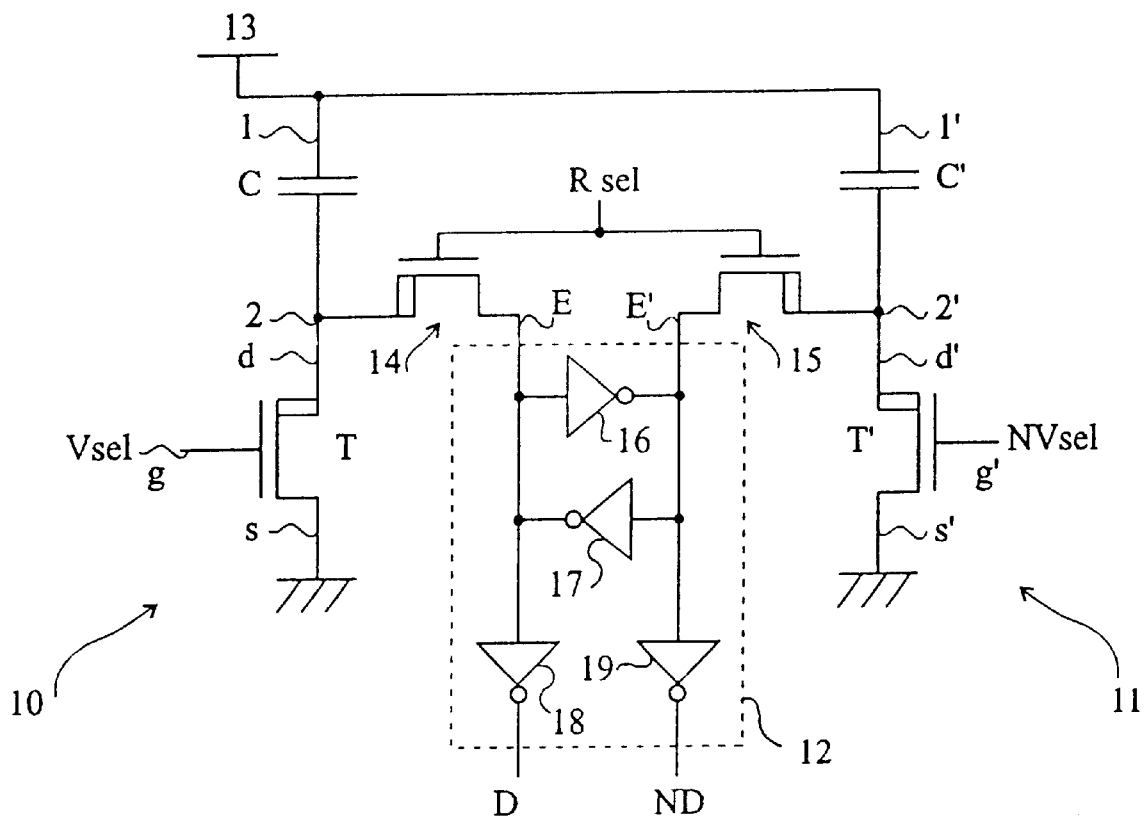
FIG. 5 is an example of a differential read circuit of OTP memory cells according to the present invention.

FIG. 5 shows an embodiment of a complete cell architecture, including a differential read stage, made from a memory cell structure such as illustrated in FIGS. 1 and 2.

Thus, relating to a differential structure, two memory cells 10, 11 are shown in FIG. 5 and use a same logic output circuit or read amplifier 12. Capacitors C and C' of the cells each have their terminal 1, 1' connected to a common terminal 13 of application of a more positive voltage. According to the present invention, the voltage applied on terminal 13 is voltage Vprog during the programming and voltage Vdd during read cycles.

The respective terminals 2, 2' of capacitors C, C' are connected to the respective drains d, d' of programming transistors T, T' of the involved cells. The sources s, s' of transistors T, T' are connected to the ground and their respective gates receive complementary selection signals VSel and NVSel.

To read from a cell, respective nodes 2 and 2' are connected, each via an NMOS transistor 14, 15, to respective inputs E, E' of logic read circuit 12. The respective gates of transistors 14 and 15 receive a read control signal RSel when a transfer of the data stored by cells 10 and 11 is required.

Conventional for a differential read system, read circuit 12 is formed of two inverters 16, 17 connected in antiparallel between terminals E and E'. Terminal E is further connected to the input of an output amplifier-inverter 18 providing the read data D. Terminal E' is connected to the input of an amplifier-inverter 19, the output terminal of which provides the complemented read data ND.

The operation of a logic differential decoding circuit such as illustrated in FIG. 5 is applied herein to OTP cells according to the present invention. Since a differential reading is involved, one of cells 10 or 11 is used as a reference to read from the other, so that the cell programming must take account of the need for the coupled cells to be complementary.

To protect logic read circuit 12 (formed from CMOS transistors) upon programming of the memory cells, transistors 14 and 15 are, like transistors T and T', unbalanced transistors, that is, the respective drains of which are made of N wells while their respective sources are conventional regions. This enables them to withstand the voltage when the potential of one of terminals 2 and 2' exceeds voltage Vdd in a programming cycle.

During programming, either cell 10 or cell 11 is selected to break down. Complementary control voltages VSel and NVSel define which of the capacitors C and C' is to break down. Signal RSel is grounded to block transistors 14 and 15. Accordingly, the read stage is protected from high voltage Vprog applied on terminal 13 during the programming cycle.

During a read cycle, terminal 13 is connected to the standard CMOS potential (for example, 2.5 V). Capacitors C and C' are precharged to level Vdd by applying a high state (Vdd) on signals VSel and NVSel. Then, nodes 2 and 2' are left floating by turning off transistors T and T' by a switching to the low level (the ground) of signals VSel and NVSel. A leakage current then flows through the oxide of the capacitor C or C' which has broken down. Node 2 or 2' of the corresponding N well is brought to voltage Vdd while remaining grounded for the unprogrammed cell, the capacitor of which remains charged to voltage Vdd. The voltage difference is detected by coupled inverters 16 and 17 when the potential of signal RSel is brought to potential Vdd, to turn on transistors 14 and 15.

It should be noted that, instead of a differential read amplifier, a conventional non-differential amplifier may also be used. In such a case, the charge time of capacitor C may for example be examined to detect whether it has or not broken down.

However, an advantage of using a differential read amplifier such as illustrated in FIG. 5 is that the reading does not depend on possible technological dispersions of the oxide impedances of the broken down capacitors.

Whatever the read amplifier used, it will be ascertained to isolate it from the cell upon programming, by means of transistors withstanding a high voltage (on the order of 10 V), preferably, unbalanced transistors of the type of those used to form the memory cell.

Preferably, the transfer of the data stored in the cell by means of signal RSel in a read cycle is performed to transfer the data to a volatile memory point (for example, a register), to enable de-biasing cells 10 and 11, to increase the lifetime of the gate oxide capacitors which have been forced at medium voltage during the programming (capacitors which did not break down but which have aged during the programming).

It should be noted that it is not indispensable for the programming voltage to be available on the final device. This depends on the application. Thus, in an application to the organization of an array of memory cells provided with redundancy elements, possible defective elements are, most often, detected during an electric test at the end of the manufacturing. Thus, the programming is not performed by the user. The finished integrated circuit thus does not require receiving voltage Vprog, since cell supply terminal 13 only needs receive voltage Vdd (for example, 2.5 V) in the read mode. In another application where memory cells of the present invention are used within a memory circuit to be programmable by the user (for example, in a memory for storing parameters to be kept after power-off), the circuit will have a terminal for receiving voltage Vprog.

It should also be noted that adapting the cell addressing signals, be it in the read mode or in programming mode, is within the abilities of those skilled in the art. In particular, the programming ramps, as well as the variation of the read control signals, may be modified according to applications.

An advantage of the present invention is that it enables forming an OTP memory cell of low cost and relatively small bulk. As a specific example of embodiment, a cell of the present invention may be formed in 0.25-$\mu$m technology on a surface on the order of 400 $\mu$m$^2$ to contain the entire cell and its read amplifier.

As a specific example of embodiment, for a capacitor of a 0.3-$\mu$m$^2$ surface, and unbalanced transistors of a 0.5-$\mu$m gate width and of a 1-$\mu$m gate length, the measured programming current is 1 mA (this current is determined by the programming transistor gate width). The read current then is 50 $\mu$A with a 2.5-volt gate voltage.

It should be noted that the well forming the drain of the unbalanced programming transistor may also be used as a well for the capacitor as illustrated in FIG. 2. A relatively dense solution is thus obtained.

Of course, the present invention is likely to have various alterations, modifications, and improvements which will readily occur to those skilled in the art. In particular, the respective sizing of an oxide capacitor and of a programming transistor of a cell according to the present invention is within the abilities of those skilled in the art according to the application and, in particular to obtain a satisfactory point of equilibrium for the memory cell.

Further, it should be noted that a cell according to the present invention may be integrated in a conventional memory cell array, the organization of a cell selection and biasing being perfectly compatible with usual techniques.

Further, although the present invention has been described in relation with an example of cell made with an N-channel programming transistor, transposing the present invention to a cell having a P-channel programming transistor can be done based on the functional indications given hereabove. In this case, the substrate is of type N and the wells of the N-channel transistors and the drain regions of the P-channel unbalanced transistors are of type P.

Such alterations, modifications, and improvements are intended to be part of this disclosure, and are intended to be within the spirit and the scope of the present invention. Accordingly, the foregoing description is by way of example only and is not intended to be limiting. The present invention is limited only as defined in the following claims and the equivalents thereto.

What is claimed is:

1. An OTP memory cell in CMOS technology, comprising a capacitor associated in series with an unbalanced programming transistor, the drain comprising a well that is made of a region deeper and less doped than a source, the drain comprising a first electrode of the capacitor, the capacitor having a second electrode formed over the drain and insulated therefrom by an oxide layer, the capacitor configured to accept a first voltage in a read mode and a second voltage in a write mode, the second voltage having a higher voltage level than the first voltage, the capacitor having the oxide configured to breakdown when subjected to the second voltage, and the transistor is sized to limit current in the memory cell while allowing a breakdown of the oxide of the capacitor, the transistor and the capacitor further sized to limit voltage across the capacitor to less than the capacitor's breakdown voltage when the capacitor is unselected during a write operation.

2. The cell of claim 1 wherein the series association of the capacitor and transistor is connected between first and second supply terminals for application of a supply voltage and a ground potential, respectively.

3. The cell of claim 1 wherein a first electrode of the capacitor is formed by said region.

4. The cell of claim 1 wherein the capacitor is formed in an oxide level constitutive of the transistor gate.

5. The cell of claim 1 wherein the transistor and the capacitor are sized so that, in a programming cycle and for an unselected cell, the voltage across the capacitor remains smaller than a breakdown voltage of the capacitor when the currents in the capacitor and in the transistor are balanced.

* * * * *